United States Patent
Meguro et al.

(10) Patent No.: US 8,193,874 B2
(45) Date of Patent: Jun. 5, 2012

(54) HIGH-FREQUENCY MODULE

(75) Inventors: Toru Meguro, Kyoto (JP); Kunihiro Watanabe, Muko (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/943,080

(22) Filed: Nov. 10, 2010

(65) Prior Publication Data

US 2012/0049945 A1    Mar. 1, 2012

Related U.S. Application Data

(63) Continuation of application No. PCT/JP2009/060214, filed on Jun. 4, 2009.

(30) Foreign Application Priority Data

Jun. 25, 2008    (JP) .................. 2008-166140

(51) Int. Cl.
 *H01P 1/10*    (2006.01)
 *H04B 1/44*    (2006.01)
(52) U.S. Cl. ......................................... 333/101; 455/78
(58) Field of Classification Search .................. 333/101, 333/103, 104; 455/78, 83
See application file for complete search history.

(56) References Cited

U.S. PATENT DOCUMENTS

| | | | |
|---|---|---|---|
| 7,596,357 B2 * | 9/2009 | Nakamata et al. | 455/78 |
| 7,756,488 B2 * | 7/2010 | Watanabe et al. | 455/78 |
| 7,773,956 B2 * | 8/2010 | Fukamachi et al. | 455/78 |
| 7,885,613 B2 * | 2/2011 | Kemmochi et al. | 455/78 |
| 2007/0123175 A1 * | 5/2007 | Watanabe et al. | 455/78 |

* cited by examiner

*Primary Examiner* — Dean O Takaoka
(74) *Attorney, Agent, or Firm* — Keating & Bennett, LLP

(57) ABSTRACT

A high-frequency switch module includes a FET switch mounted on a multilayer substrate and a low pass filter arranged between the FET switch and a transmission signal input terminal. The low pass filter includes at least one inductor connected in series between a transmission input port and the transmission signal input terminal, a first capacitor, one end of which is connected to the transmission input port and the other end of which is grounded, and a second capacitor, one end of which is connected to the transmission signal input terminal and the other end of which is grounded, and the first capacitor and the second capacitor have different capacitance values.

5 Claims, 7 Drawing Sheets

HIGH-FREQUENCY MODULE

BACKGROUND OF THE INVENTION

1. Field of the Invention

The present invention relates to a high-frequency module, and in particular, to a high-frequency switch module arranged to switch a communication signal having a specific frequency using a FET switch.

2. Description of the Related Art

Presently, there is a plurality of specifications used in wireless communications systems for cellular phones or other suitable devices. In Europe, for example, a multi-band GSM system is used. In the GSM system, a plurality of communication signals (transmission/reception signals) using different frequency bands, such as an 850 MHz band and a 900 MHz band, are used. Furthermore, an 1800 MHz band and a 1900 MHz band are also used. When these multiple communication signals in different frequency bands are received by a single antenna, communication signals other than those of a target frequency band are not processed. Even in the case of a single communication signal, a reception signal is not processed during transmission, and a transmission signal is not processed during reception. Thus, when transmission and reception are performed using a single antenna, there is a need for switching between a path for transmitting a transmission signal and a path for receiving a reception signal. For such switching, various high-speed switch modules using FET switches have been developed (see Japanese Unexamined Patent Application Publication No. 2002-185356, for example).

In Japanese Unexamined Patent Application Publication No. 2002-185356, the high-frequency switch module as illustrated in FIG. 9 is provided. FIG. 9 is a block diagram illustrating the configuration of an existing high-frequency switch module. The existing high-frequency switch module is provided with a FET switch SW100 including a transmission port RF101 to which the transmission signal (first transmission signal) of a first communication signal and the transmission signal (second transmission signal) of a second communication signal are input, a first reception port RF102 arranged to output the reception signal (first reception signal) of the first communication signal, a second reception port RF103 arranged to output the reception signal (second reception signal) of the second communication signal, an antenna port ANT0 arranged to perform input/output of the first and second transmission signals and of the first reception signal and the second reception signal, for an antenna ANT. A switch defined by a semiconductor device, preferably a FET, is used for the FET switch SW100, and currently, a GaAs switch is often used. In the existing high-frequency module, a low pass filter LPF201 for attenuating the harmonics of the first and second transmission signals is connected to the transmission port RF101, a band pass filter BPF301 for passing the fundamental frequency of the first reception signal is connected to the first reception port RF102, and a band pass filter BPE302 for passing the fundamental frequency of the second reception signal is connected to the second reception port RF103.

In the high-frequency switch module described above, a transmission signal is input to an input terminal Tx1 which is connected to the transmission port RF101 of the FET switch SW100 via the low pass filter LPF201. This transmission signal is usually input after being amplified by a power amplifier connected in a prior stage. At this time, the higher harmonics of the fundamental frequency $f_0$ of the transmission signal generated during the amplification are also input together with the transmission signal having the fundamental frequency $f_0$. Here, if the low pass filter LPF201 of the high-frequency switch module illustrated in FIG. 9 has been set so as to attenuate the higher harmonics, the higher harmonics of the transmission signal input to the FET switch SW100 can be suppressed. For instance, by configuring the low pass filter LPF201 using a low pass filter attenuating the second harmonic ($2 \cdot f_0$) of the fundamental frequency $f_0$ and a low pass filter attenuating the third harmonic ($3 \cdot f_0$) of the fundamental frequency $f_0$, these second and third harmonics are suppressed.

However, when the FET switch SW100 is defined by a GaAs switch, upon input of a high-frequency transmission signal, harmonic distortion is generated in the FET switch SW100, whereby harmonics such as the second harmonic and the third harmonic are uniformly output to each port. At this time, the low pass filter LPF201 at the harmonic frequencies appears to be in an open state having nearly infinite impedance from the viewpoint of the transmission port RF101. Thus, the harmonics generated in the FET switch SW100 are completely reflected at the transmission port RF101 side end of the low pass filter LPF201 and input to the FET switch SW100. Consequently, by letting "X" denote the initial harmonics and "α" denote an increase in the harmonics due to the complete reflection, harmonics of "X+α" are unfavorably output from the antenna port ANT0.

To suppress these harmonics, a GaAs switch which is unlikely to generate harmonics is required. However, a GaAs switch that is unlikely to generate harmonics does not exist. Alternatively, if a switch circuit including a diode switch is used, harmonics are unlikely to be generated. However, at least two diodes are required for switching between transmission and reception for each communication signal, and circuits accompanying the diodes are also required. This prevents a decrease in the size of a high-frequency switch module. Furthermore, the use of multiple diode switches causes an increase in power consumption and a decrease in response time. In particular, this influence increases as the number of the FET switch ports increases.

SUMMARY OF THE INVENTION

To overcome the problems described above, preferred embodiments of the present invention provide a high-frequency switch module which has a decreased size and which suppresses harmonic distortion while using a FET switch, such as a GaAs switch.

A high-frequency switch module according to a preferred embodiment of the present invention includes a multilayer substrate including a plurality of stacked dielectric layers and electrode layers, a FET switch that is mounted on a first main surface of the multilayer substrate and includes a transmission input port arranged to input a transmission signal, a reception output port arranged to output a reception signal, and an antenna port arranged to output the transmission signal to an antenna and/or to input the reception signal from the antenna, and that connects the antenna port to the transmission input port or the reception output port by switching, and a filter that is provided on a main surface of and/or within the multilayer substrate, wherein a first input/output terminal of the filter is connected to the transmission input port, a second input/output port of the filter is connected to a transmission signal input terminal, and the filter attenuates higher harmonics of the transmission signal. A transmission input electrode, a reception output port electrode, and an antenna port electrode respectively connected to the transmission input port, the reception output port, and the antenna port via connection elements are provided on the first main surface of the multilayer substrate. A transmission signal input terminal mounting electrode that is connected to the transmission signal input terminal via a connection element is provided on a second main surface of the multilayer substrate. The filter includes at least one inductor connected in series between the transmission input port and the transmission signal input terminal, a first capacitor, one end of which is connected to the transmission input port and the other end of which is grounded, and a second capacitor, one end of which is connected to the transmission signal input terminal and the other end of which is grounded. The first capacitor and the second capacitor have different capacitance values, at least one capacitor electrode included in the first capacitor is directly connected to the transmission input port electrode using a conduction via hole provided within the multilayer substrate, and at least one capacitor electrode included in the second capacitor is directly connected to the transmission signal input terminal mounting electrode using a conduction via hole provided within the multilayer substrate.

This configuration enables the phase of higher harmonics generated in the FET switch to be changed at the FET switch transmission input port side end of the filter without adding a component, and enables the amount of higher harmonics radiated from an antenna to be reduced.

Furthermore, in the high-frequency switch module according to a preferred embodiment of the present invention, a bonding wire is preferably used as the connection element, and a phase adjustment circuit arranged to change phases of the higher harmonics using an inductance of the bonding wire and a capacitance value of the first capacitor is preferably provided. This configuration increases the freedom of design with respect to phase adjustment and more reliably reduces the higher harmonics.

Furthermore, in the high-frequency switch module according to a preferred embodiment of the present invention, the inductor is preferably arranged on the first main surface side of the multilayer substrate in a stacking direction, and the capacitor electrode is preferably arranged on the second main surface side of the multilayer substrate in the stacking direction. This configuration decreases coupling between the magnetic field generated by the inductor and the magnetic field generated by the wiring electrodes provided on a circuit board for mounting the high-frequency switch module, thereby reducing variations in the inductance value, and thus, suppressing variations in the characteristics of the high-frequency switch module.

Furthermore, in the high-frequency switch module according to a preferred embodiment of the present invention, the filter is preferably a low pass filter having a stopband that includes a frequency of a second or third harmonic among the higher harmonics. This configuration enables the higher harmonics to be suppressed in the low pass filter even when the second or third harmonic is transmitted from a power amplifier in a prior stage.

Furthermore, in the high-frequency switch module according to a preferred embodiment of the present invention, the high-frequency switch module preferably performs input/output of a plurality of communication signals each utilizing a specific frequency band for a transmission signal and a reception signal, and the FET switch preferably includes a reception output port for at least each of the communication signals. This configuration suppresses higher harmonics by providing a low pass filter at the transmission input port, even in a high-frequency switch module performing input/output of a plurality of communication signals.

According to various preferred embodiments of the present invention, the amount of higher harmonics radiated from an antenna can be decreased without increasing the number of components, thereby providing a small-sized high-frequency switch module that generates greatly reduced amounts of higher harmonics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, high-frequency switch modules according to preferred embodiments of the present invention will be described with reference to the attached drawings. Note that the same numerals are assigned to common components or portions in the respective drawings, and duplicated description is omitted.

First Preferred Embodiment

Figure 1:
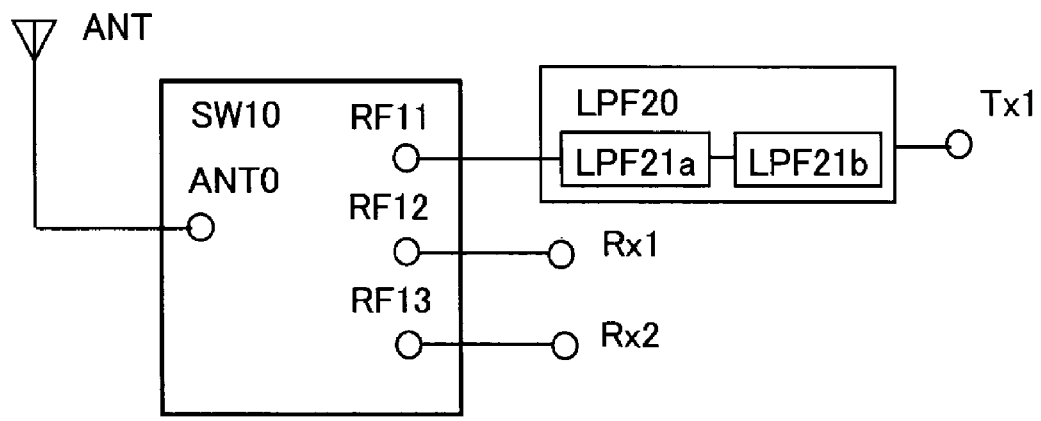
FIG. 1 is a block diagram illustrating a high-frequency switch module according to a first preferred embodiment of the present invention.

FIG. 1 is a block diagram illustrating the configuration of a high-frequency switch module according to a first preferred embodiment of the present invention. Note that in the descriptions of the present preferred embodiment, descriptions are provided of a high-frequency switch module in which a GSM 850 MHz transmission signal or a GSM 900 MHz signal is input from a transmission signal input terminal Tx1, a GSM 850 MHz reception signal is output from a reception signal output terminal Rx1, and a GSM 900 MHz reception signal is output from a reception signal output terminal Rx2. A FET switch SW10 defined by a GaAs switch includes input/output ports RF11, RF12, and RF13 (hereinafter called "RF11 port", "RF12 port", and "RF13 port") connected to an antenna ANT. The FET switch SW10 includes a drive voltage input terminal, not illustrated, arranged to input a drive voltage and a control signal input terminal, not illustrated, arranged to input a control signal used to control switching of the switch. The antenna port ANT0 is electrically connected to one of the ports RF11, RF12, and RF13 in accordance with the control signal input to the control signal input terminal. Note that in the present preferred embodiment, since the transmission signal input terminal Tx1 is connected to the RF11 port, and the reception signal output terminals Rx1 and Rx2 are respectively connected to the RF12 port and the RF13 port, the RF11 port corresponds to the "transmission signal input port" and the RF12 port and the RF13 port each correspond to a "reception signal output port".

A low pass filter LPF20 includes two low pass filters LPF21a and LPF21b having different frequency characteristics, i.e., different attenuation characteristics. The low pass filter LPF21a and the low pass filter LPF21b are connected in this order from the FET switch SW10 side. The low pass filter LPF21a has frequency characteristics such that the fundamental frequency of a GSM 850 MHz transmission signal exists in the passband and a frequency twice the fundamental frequency of a GSM 850 MHz transmission signal exists in the stopband, and such that the fundamental frequency of a GSM 900 MHz transmission signal exists in the passband and a frequency twice the fundamental frequency of a GSM 900 MHz transmission signal exists in the stopband. The low pass filter LPF21b has frequency characteristics such that at least the fundamental frequency of a GSM 850 MHz transmission signal exists in the passband and a frequency three times the fundamental frequency of a GSM 850 MHz transmission signal exists in the stopband, and such that at least the fundamental frequency of a GSM 900 MHz transmission signal exists in the passband and a frequency three times the fundamental frequency of a GSM 900 MHz transmission signal exists in the stopband.

The end of the low pass filter LPF20 opposite to the FET switch SW10 is connected to the transmission signal input terminal Tx1 which is connected to a power amplifier (not illustrated) in a prior stage.

Figure 2:
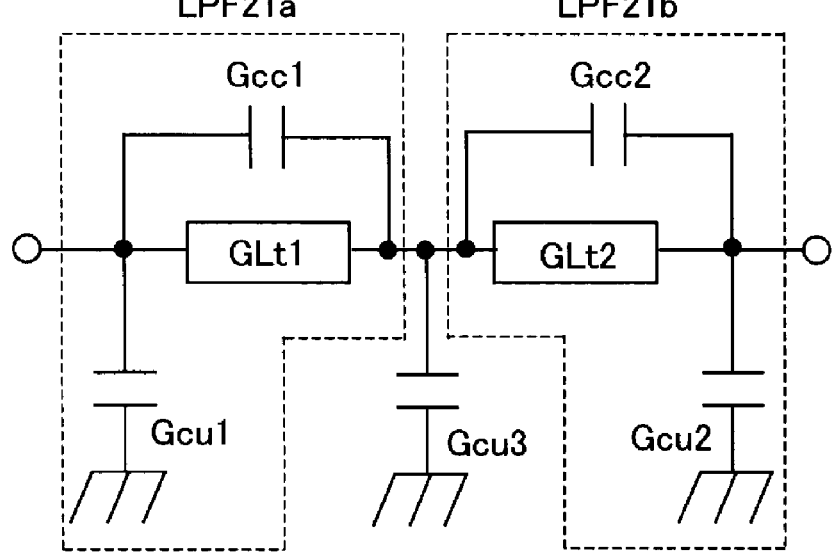
FIG. 2 is a circuit diagram illustrating a low pass filter.

FIG. 2 illustrates the circuit configuration of the low pass filter LPF20. LPF21a is connected to LPF21b, and LPF21b is connected to the transmission signal input terminal Tx1. The connection node of LPF21a and LPF21b is connected to the ground via a capacitor GCu3. LPF21a includes an inductor GLt1 including a transmission line, one end of which is connected to the RF11 port of the FET switch and the other end of which is connected to LPF21b, a capacitor GCc1 connected in parallel to the inductor GLt1, a capacitor GCu1 inserted between the FET switch SW10 side of the inductor GLt1 and the ground. LPF21a is set such that the second harmonic frequencies of a GSM 850 MHz transmission signal and a GSM 900 MHz transmission signal exist in the stopband and the fundamental frequencies exist in the passband by providing the inductor GLt1 and the capacitors GCc1 and GCu1.

LPF21b includes an inductor GLt2 including a transmission line, one end of which is connected to LPF21a and the other end of which is connected to the transmission signal input terminal Tx1, a capacitor GCc2 connected in parallel to the inductor GLt2, a capacitor GCu2 inserted between the transmission signal input terminal Tx1 side of the inductor GLt2 and the ground. The low pass filter LPF21b is set such the third harmonic frequencies of a GSM 850 MHz transmission signal and a GSM 900 MHz transmission signal exist in the stopband and the fundamental frequencies exist in the passband by providing the inductor GLt2 and the capacitors GCc2 and GCu2.

Note that although the RF12 port and the RF13 port of the FET switch SW10 are preferably respectively connected to the reception signal output terminal Rx1 and the reception signal output terminal Rx2, a bandpass filter having a passband in which the frequencies of a GSM 850 MHz reception signal exist may be inserted between the RF12 port and the reception signal output terminal Rx1, and a bandpass filter having a passband in which the frequencies of a GSM 900 MHz reception signal exist may be inserted between the RF13 port and the reception signal output terminal Rx2.

Figure 3A:
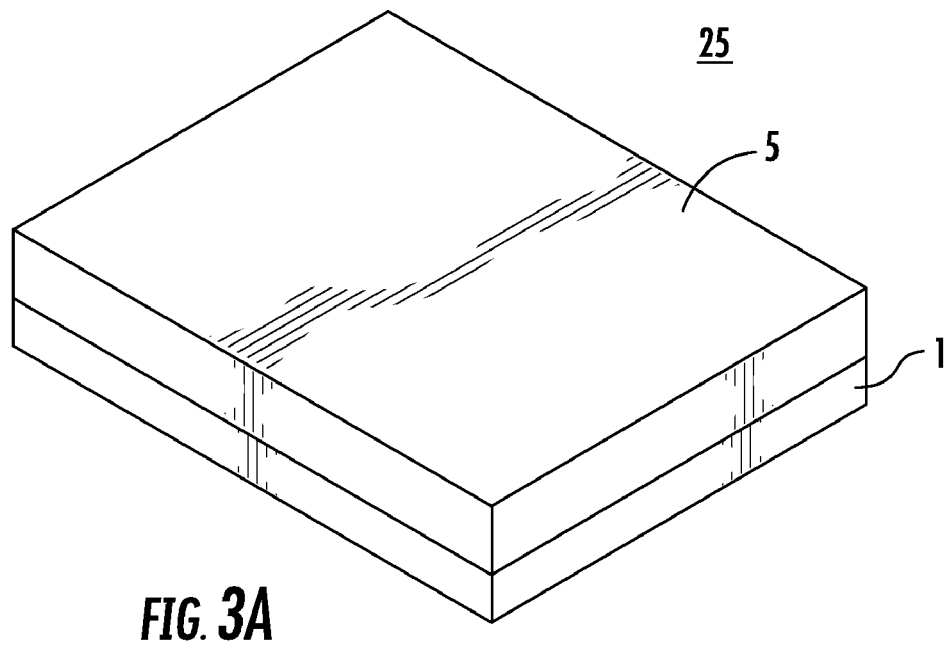
FIGS. 3A and 3B illustrate schematic perspective diagrams of the high-frequency switch module according to the first preferred embodiment of the present invention.
Figure 3B:
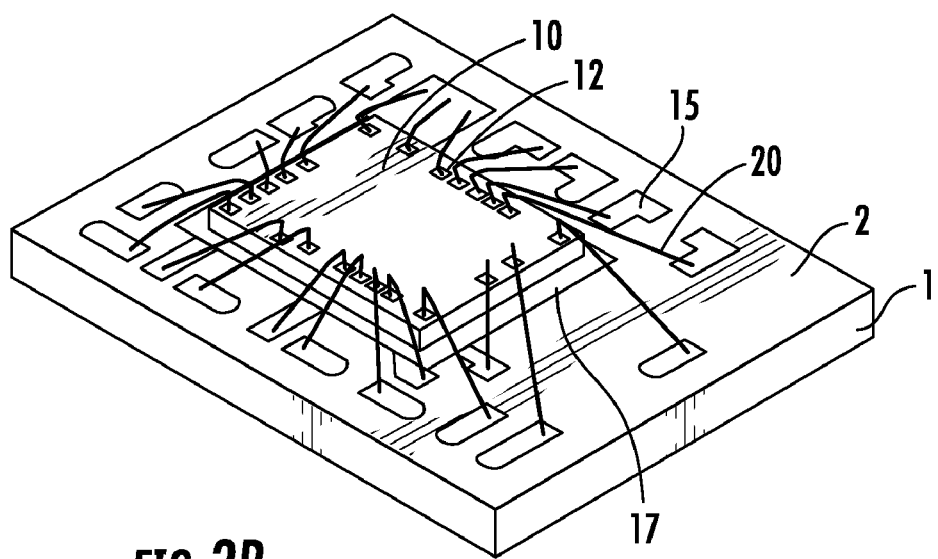

FIGS. 3A and 3B illustrate schematic perspective diagrams of the high-frequency switch module according to the present preferred embodiment. FIG. 3A is a schematic perspective view of the present preferred embodiment, and FIG. 3B is a perspective view illustrating the packaging of the FET switch and the electrode arrangement. Referring to FIG. 3A, the high-frequency switch module according to the present preferred embodiment includes a protection layer 5 preferably defined by a resin or other suitable material, for example, on a first main surface of a multilayer substrate 1 including a stack of a plurality of dielectric layers and wiring electrodes. Referring to FIG. 3B, a FET switch mounting electrode 17 and terminal electrodes 15 preferably formed by printing, using screen printing or other suitable method, for example, conductive materials such as Ag and Cu, for example, followed by sintering are arranged on the first main surface 2. The back surface of the FET switch SW10 is bonded and fixed onto the FET switch mounting electrode 17 preferably using conductive adhesive or other suitable bonding material, for example. Au electrodes, for example, are preferably formed on the surfaces of the terminal electrodes 15. Connection electrodes 12 arranged on the surface of the FET switch SW10 are electrically connected to the terminal electrodes 15 on the multilayer substrate 1 preferably using bonding wires 20 made of Au or other suitable material, for example. A connection electrode 12 defining the ground electrode is electrically connected to the FET switch mounting electrode 17 using a bonding wire.

Inductor electrodes and capacitor electrodes defining the low pass filter LPF20 are provided within the multilayer substrate 1. Specified electrodes among these electrodes are connected to the terminal electrodes 15 preferably using conduction via holes formed within the multilayer substrate 1, for example. Each of the terminal electrodes 15 preferably has an approximate D-shape in plan view, for example. A conduction via hole is preferably provided near the arch portion of the terminal electrode 15, and a bonding wire is preferably connected to a portion of the electrode opposite the arch portion. This configuration prevents a bonding wire from being connected to the conduction via hole defined by filling conductive paste or other suitable material.

The structure of the multilayer substrate 1 defining the high-frequency switch module illustrated in FIG. 3 will now be described with reference to FIG. 4.

Figure 4:
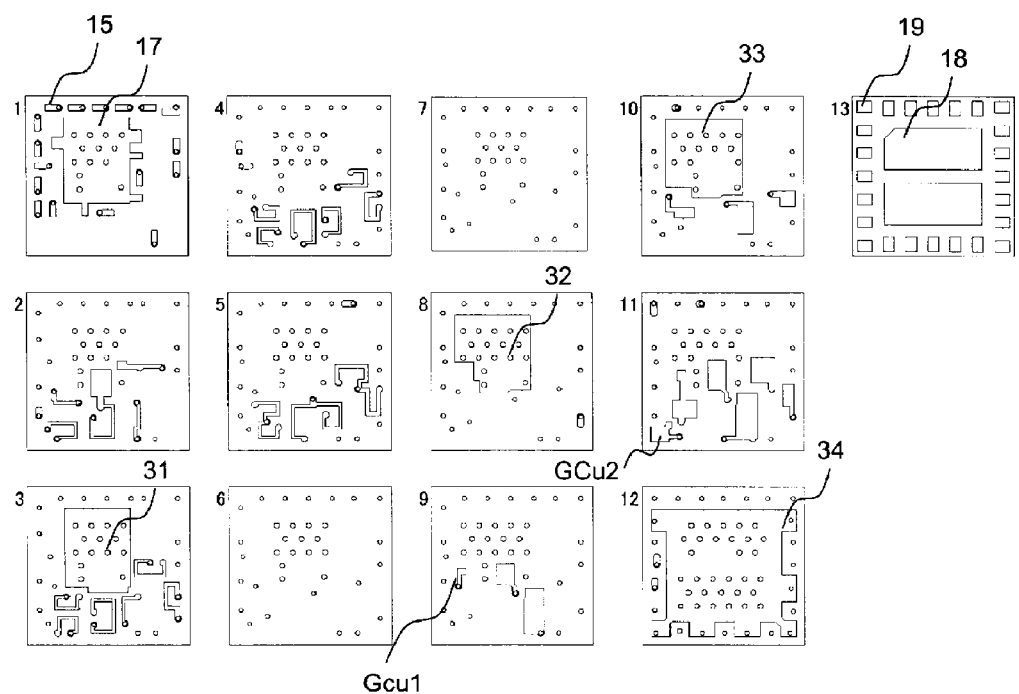
FIG. 4 is a stacking diagram of the high-frequency switch module according to the first preferred embodiment of the present invention.

FIG. 4 is a stacking diagram of the multilayer substrate 1 according to the present preferred embodiment. FIG. 4 illustrates dielectric layers 1 to 12 sequentially shown from above, in which the dielectric layer 13 is the back surface of the dielectric layer 12, i.e., the bottom surface of the high-frequency switch module. The characters illustrated in FIG. 4 correspond to the characters denoting the respective components illustrated in FIG. 2. In FIG. 4, circles represent conduction via holes and patterns other than the circles represent wiring electrodes.

The multilayer substrate 1 is formed by stacking the dielectric layers 1 to 12 in the numbering order from the top with the dielectric layer 1 being the uppermost layer. The FET switch mounting electrode 17 and the terminal electrodes 15 arranged to mount the FET switch SW10 are provided on the front surface of the uppermost dielectric layer 1. The bottom surface (dielectric layer 13 in FIG. 4) of the lower most dielectric layer 12 includes ground electrodes 18 arranged near the center thereof and external connection electrodes 19 arranged at the peripheral portion thereof. Using these electrodes, this high-frequency switch module is mounted on an external circuit board. Note that while the external connection electrodes 19 are preferably land grid array (LGA) electrodes arranged near the peripheral portion of the dielectric layer 12, electrodes not only on the bottom surface of the dielectric layer electrodes but also on the sides of the multilayer substrate 1 may be used for the external connection.

The FET switch mounting electrode 17 is electrically connected to the ground electrodes 18 by conduction via holes, and electrodes 31, 32, 33, and 34 are arranged below the FET switch mounting electrode 17 so as to be electrically connected to the conduction via holes. The electrodes 31, 32, 33, and 34 are provided so as to ensure a sufficient grounding connection for the FET switch SW10, which reduces the value of stray inductance generated at the conduction via hole portions.

Further, an electrode of the capacitor GCu1 included in LPF21a is arranged on the dielectric layer 9 so as to provide capacitance between an electrode 33 arranged below the electrode. An electrode of the capacitor GCu2 included in LPF21b is arranged on the dielectric layer 11 so as to provide capacitance between an electrode 34 arranged below the electrode. As shown in FIG. 4, the electrodes which respectively define GCu1 and Gcu2 preferably have different sizes and therefore generate different capacitance values. In addition to changing the sizes of the capacitor electrodes, as described above, different capacitance values may be obtained between the two capacitor electrodes by making the thickness of the dielectric layer between GCu1 and the electrode 33 different from the thickness of the dielectric layer between GCu2 and the electrode 34, for example.

Furthermore, in the multilayer substrate in the present preferred embodiment, capacitor electrodes are preferably arranged on the lower layers, such as the dielectric layers 9 to 11 illustrated in FIG. 4, of the multilayer substrate, and inductor electrodes are preferably arranged on the upper layers, such as the dielectric layers 2 to 5, of the multilayer substrate. When the high-frequency switch module 25 including the multilayer substrate 1 is mounted on a circuit board, the above-described structure decreases coupling between the magnetic field generated by the inductor electrodes within the multilayer substrate 1 and the magnetic field generated by the electrodes on the circuit board, thereby reducing the variations in the inductance value within the multilayer substrate and the influence on the external circuits. Note that materials that can be used for the dielectric layers in the present preferred embodiment may be resins such as liquid polymers and polyimide in addition to a ceramic substrate that can be simultaneously sintered together with the wiring electrodes, for example.

The operation of the high-frequency switch module according to the present preferred embodiment at transmission of a GSM 850 MHz transmission signal and a GSM 900 MHz transmission signal (hereinafter generally referred to as a GSM transmission signal) will now be described. Note that the signals are not simultaneously input, and only one of the transmission signals is input at a given time.

When a GSM transmission signal is input to the FET switch SW10, harmonic distortion is generated due to the nonlinearity of the GaAs switch, and harmonics having certain magnitudes are uniformly or substantially uniformly output to each port (RF11 port, RF12 port, RF13 port, and antenna port ANT0). The harmonics output from the RF11 port are transmitted to the low pass filter LPF20. The higher harmonics transmitted to the low pass filter LPF20 are reflected at the SW10 side end of the low pass filter LPF20, and higher harmonics having certain magnitudes are again input to SW10. The higher harmonics again input to SW10 are radiated from the antenna, and as a result, higher harmonics which are the sum of the higher harmonics generated in the FET switch SW10 and the returning higher harmonics reflected at the SW10 side end of the low pass filter LPF20 are output from the antenna.

At this time, the phases of the higher harmonics reflected at the SW10 side end of the low pass filter LPF20 can be changed by setting the value of the capacitor GCu1 on the FET switch SW10 side of the low pass filter LPF21a to be different from that of the capacitor GCu2 on the side opposite the FET switch SW10. In other words, the higher harmonics can be completely reflected at the SW10 side of the low pass filter LPF20 by adjusting the value of the capacitor GCu1 such that the phases of the higher harmonics, which are generated in the FET switch SW10, reflected at the low pass filter LPF20, and input again to SW10, become zero or substantially zero degrees. The completely reflected higher harmonics return to the FET switch SW10. However, at this time, the antenna port ANT0 is electrically connected to the RF11 port in the FET switch SW10, and a transmission line extending between the ANT0 port and the RF11 port in the FET switch SW10 is very short, has a line impedance of zero or approximately zero, and causes substantially no phase change. Thus, the second and third harmonics which have returned to the RF11 port from the low pass filter LPF20 are completely reflected at the ANT0 port, guided to the RF input/output ports other than the RF11 port, such as the RF12 port and RF13 port, and are distributed to external circuits connected to these RF ports. This enables the amount of higher harmonics output from the ANT0 port to be greatly reduced.

Figure 5A:
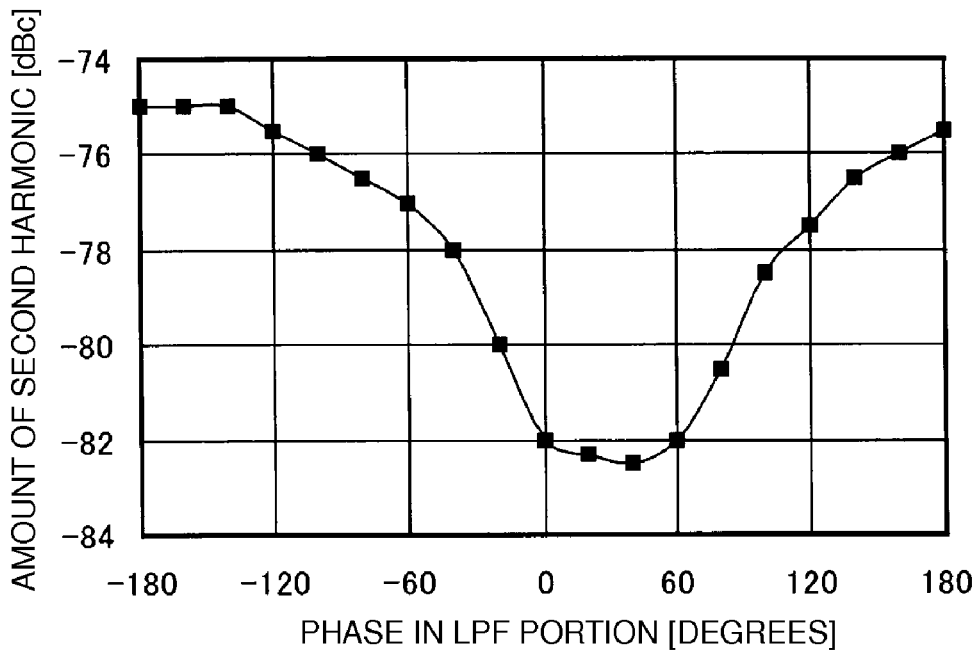
FIGS. 5A and 5B are characteristic diagrams of harmonic distortion characteristics of the high-frequency switch module according to the first preferred embodiment of the present invention.
Figure 5B:
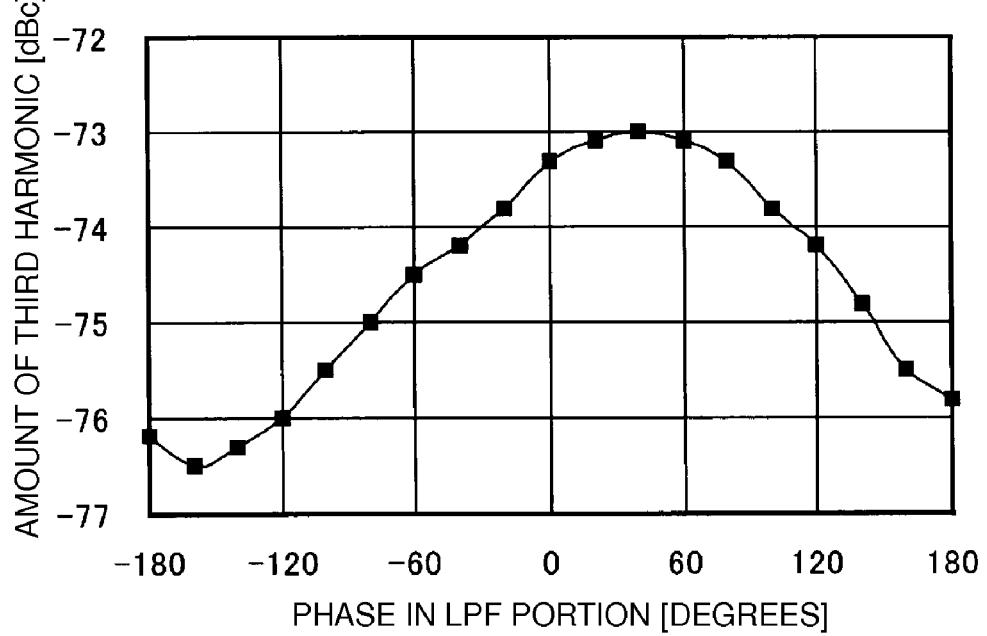

FIGS. 5A to 6B illustrate the changes in the amounts of the second and third harmonics radiated from an antenna when the phases of the higher harmonics reflected at the SW10 side end of LPF 20 and input to SW10 are changed by changing the value of the capacitor GCu1. FIGS. 5A and 5B respectively illustrate the change in the amount, radiated from an antenna, of the second harmonic and the change in the amount, radiated from an antenna, of the third harmonic of signals in the GSM 850 MHz and GSM 900 MHz bands versus the phase of a signal reflected at the switch SW10 side end of the low pass filter LPF20. Referring to FIG. 5A, it can be seen that the amount of the second harmonic radiated from an antenna is approximately −82 dBc when the phase of the second harmonic reflected at the switch SW10 side end of the low pass filter LPF20 is approximately 30 degrees, thereby achieving a reduction of approximately 7 dBc as compared to the amount of radiation when the phase is approximately 180 degrees. Referring to FIG. 5B, it can be seen that the amount of the third harmonic radiated from an antenna is approximately −76.5 dBc when the phase of the third harmonic reflected at the switch SW10 side end of the low pass filter LPF20 is approximately −160 degrees, thereby achieving a reduction of approximately 3 dBc as compared to the amount of radiation when the phase is approximately 40 degrees.

It can be seen that the reduction in the amount of the second harmonic and the reduction in the amount of the third harmonic of the GSM 850 MHz band and the GSM 900 MHz band are different depending on the phase of a signal reflected at the switch SW10 side end of the low pass filter LPF20. This is because, in the case of LPF21b, the third harmonic from SW10 undergoes a phase change when passing through LPF21a. As can be seen from FIGS. 5A and 5B, the absolute values of the second harmonic and the third harmonic are different, and the amount of the third harmonic is greater in the present preferred embodiment. Thus, when the third harmonic is to be actively attenuated, the phase is set to approximately −160 degrees by adjusting the value of the capacitor GCu1. In this manner, by appropriately setting the value of the capacitor GCu1, a specified higher harmonic can be reduced a desirable radiation amount.

Figure 6A:
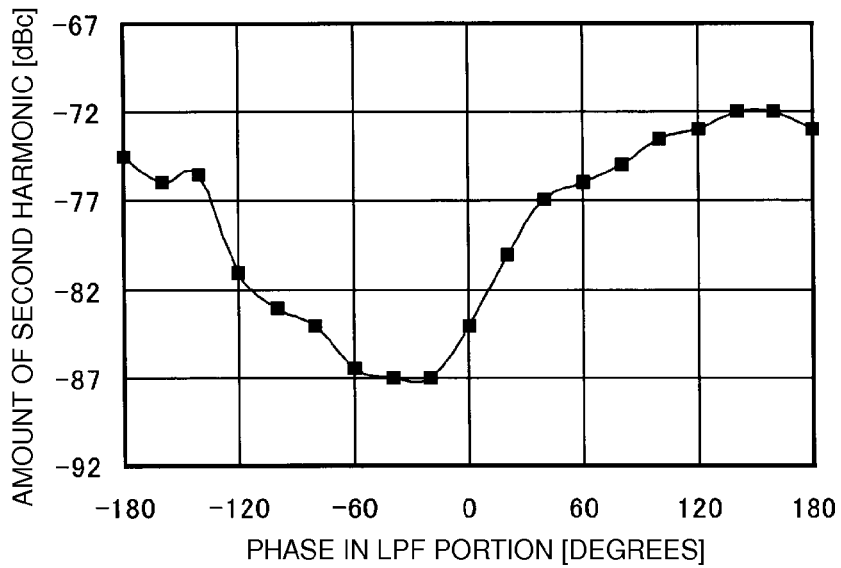
FIGS. 6A and 6B are characteristic diagrams of harmonic distortion characteristics of the high-frequency switch module according to the first preferred embodiment of the present invention.
Figure 6B:
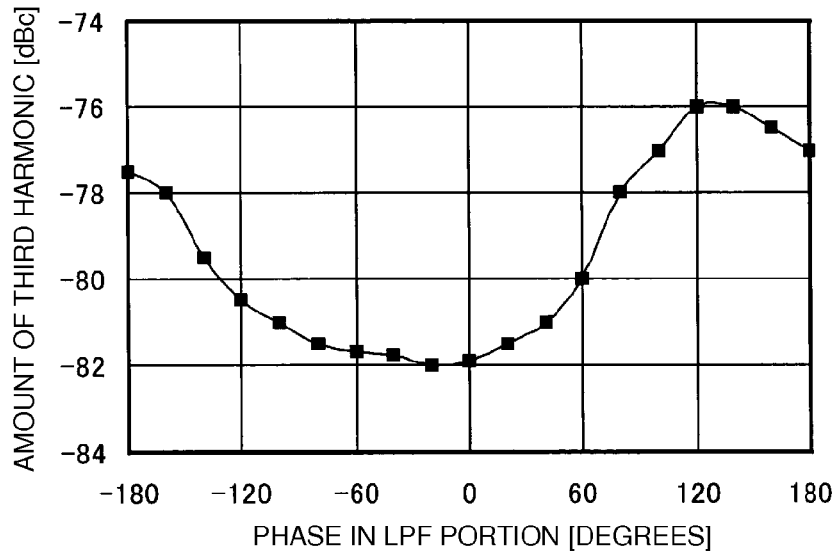

Although a high-frequency switch module for switching a GSM 850 MHz signal and a GSM 900 MHz signal has been described in the above-described preferred embodiment, the high-frequency switch module may also be used also for switching a GSM 1800 MHz signal and a GSM 1900 MHz signal instead of a GSM 850 MHz signal and a GSM 900 MHz signal. FIGS. 6A and 6B illustrate higher harmonics radiated from an antenna versus the phase of higher harmonics reflected at the switch SW10 side end of the low pass filter LPF20. As can be seen from FIGS. 6A and 6B, regarding the second and third harmonics of the GSM 1800 MHz band and GSM 1900 MHz band, the amount of radiation from an antenna reduced to the greatest extent by setting both of the phases to approximately −40 degrees. In this manner, both of the second and third harmonics may be reduced by setting the capacitors GCu1 and GCu2 at specified values.

Second Preferred Embodiment

Figure 7:
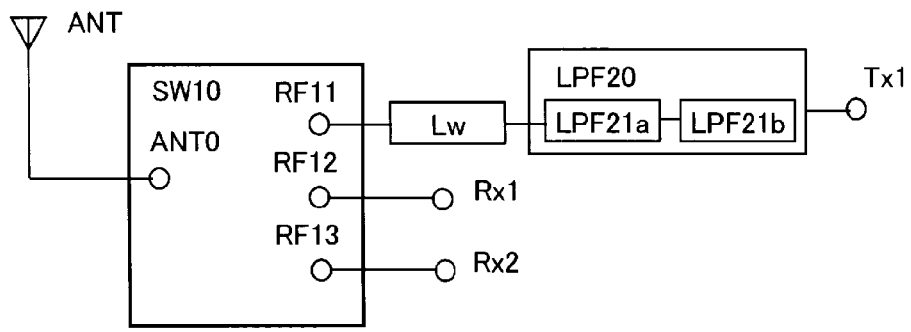
FIG. 7 is a block diagram illustrating a high-frequency switch module according to a second preferred embodiment of the present invention.

FIG. 7 is a block diagram illustrating the configuration of a high-frequency switch module according to a second preferred embodiment of the present invention. The difference from the first preferred embodiment is that an inductor Lw, which is preferably a bonding wire, for example, is provided between the low pass filter LPF20 and the FET switch SW10, and the phase adjustment of higher harmonics is performed using Lw. This bonding wire corresponds to the bonding wire 20 illustrated in FIG. 3B, which is a schematic perspective view of the first preferred embodiment.

In the first preferred embodiment, the amount of higher harmonics output from an antenna is reduced by adjusting the phases of higher harmonics generated in the FET switch SW10 using the capacitors GCu1 and GCu2, which are elements of the low pass filter LPF20, and adjusting the phase between higher harmonics output to the low pass filter LPF20 side from the FET switch SW10 and higher harmonics reflected at the SW10 side end of the low pass filter LPF20 so as to make the phase approximately zero. In this manner, phase adjustment is performed using only capacitors in the first preferred embodiment. However, there are restrictions on the amount or direction of change in the phase when using only capacitors. To supplement this, an inductor, whose characteristics are different from those of a capacitor, is used to increase the phase adjustment range and the design freedom for both of the second and third harmonics.

Note that the characteristics of the low pass filter LPF20 can be optimized by designing the low pass filter LPF20 to take into account, for example, the characteristics of the FET switch SW10, such as the S parameter and the inductance values of the bonding wires connecting the FET switch SW10 and the mounting terminal electrodes on the multilayer substrate.

Figure 8A:
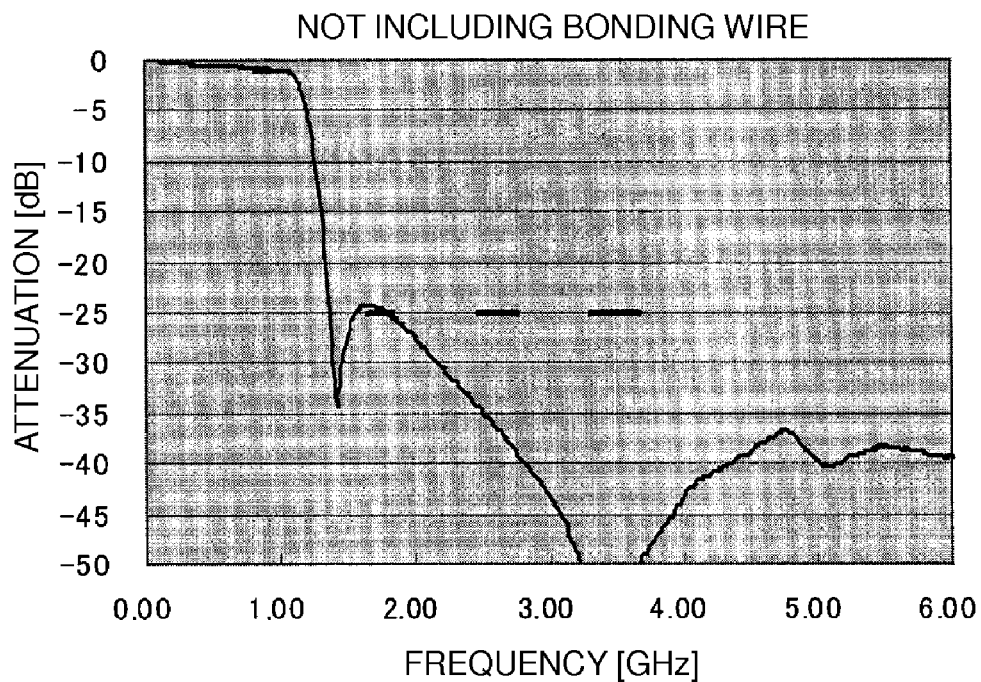
FIGS. 8A and 8B are characteristic diagrams of a low pass filter.
Figure 8B:
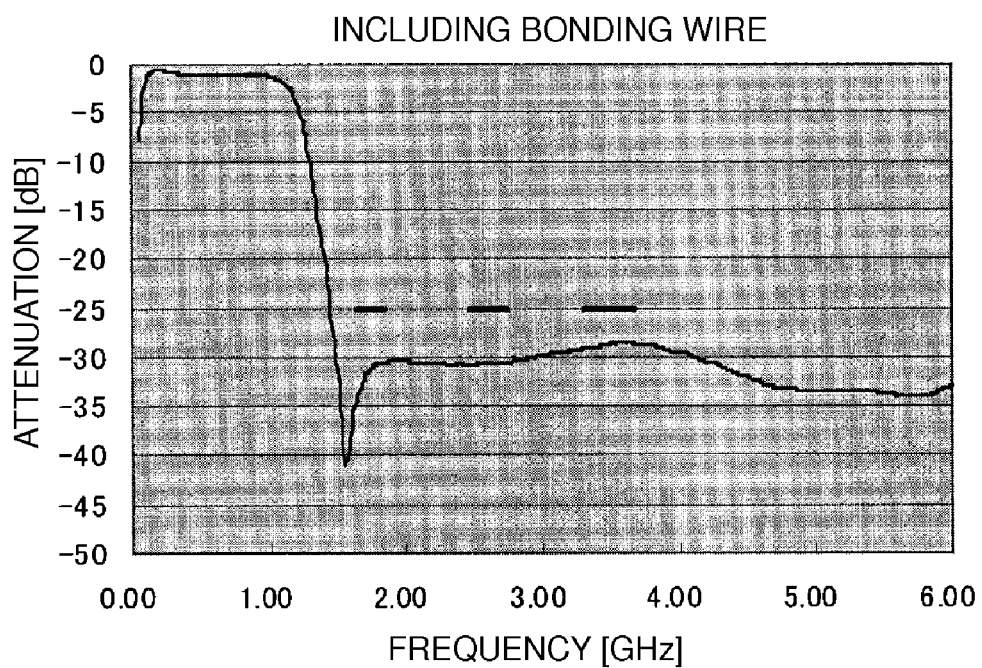
Figure 9:
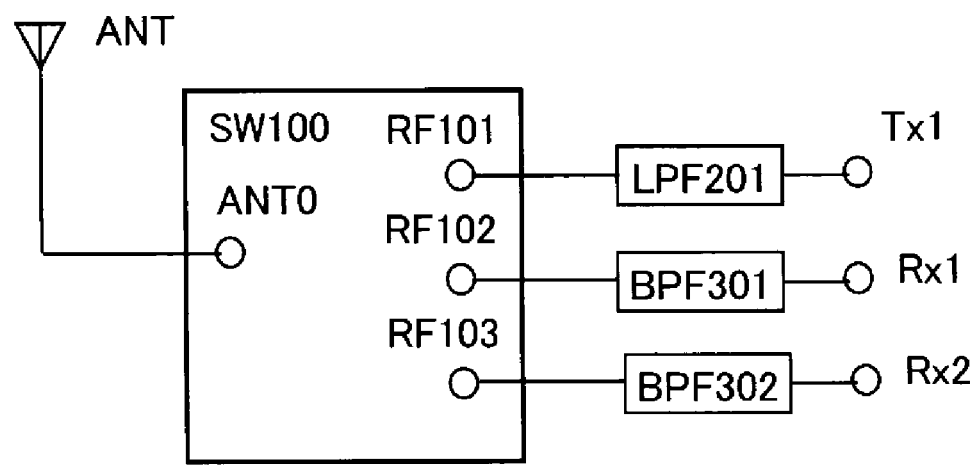
FIG. 9 is a block diagram illustrating a known high-frequency switch module.

In addition, since the bonding wire inductor also functions as a component of the low pass filter LPF20, the order of low pass filter LPF20 is preferably increased, thereby improving the design freedom. FIGS. 8A and 8B illustrate the attenuation characteristics of the passband of the low pass filter LPF20 near the high frequency side when the bonding wire inductor is included in the low pass filter LPF20. Referring to FIG. 8A, desired attenuation is not obtained near 1.9 GHz, which is on the high frequency side of the passband of the low pass filter LPF20, when the low pass filter LPF20 is designed without including the bonding wire inductor. When the bonding wire inductor is included in the design, the attenuation near 1.9 GHz is increased as illustrated in FIG. 8B, which improves the attenuation characteristics on the high frequency side of the passband of the low pass filter LPF20. As described above, the characteristics of a high-frequency switch module are improved without adding any unnecessary components by utilizing an inductor defined by a bonding wire arranged to attenuate higher harmonics and to improve the attenuation characteristics on the high frequency side of the passband of an LPF.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency switch module comprising:
a multilayer substrate including a plurality of stacked dielectric layers and electrode layers;
a FET switch mounted on a first main surface of the multilayer substrate and including a transmission input port arranged to input a transmission signal, a reception output port arranged to output a reception signal, and an antenna port arranged to output the transmission signal to an antenna or input the reception signal from the antenna, the FET switch being arranged to selectively connect the antenna port to the transmission input port or the reception output port by switching; and
a filter provided on at least one of a main surface of or within the multilayer substrate and including a first input/output terminal connected to the transmission input port, a second input/output port connected to a transmission signal input terminal, the filter being arranged to attenuate higher harmonics of the transmission signal; wherein
a transmission input port electrode, a reception output port electrode, and an antenna port electrode respectively connected to the transmission input port, the reception output port, and the antenna port via connection elements are provided on the first main surface of the multilayer substrate;
a transmission signal input terminal mounting electrode that is connected to the transmission signal input terminal via a connection element is provided on a second main surface of the multilayer substrate opposite to the first main surface;
the filter includes at least one inductor connected in series between the transmission input port and the transmission signal input terminal, a first capacitor, one end of which is connected to the transmission input port and another end of which is grounded, and a second capacitor, one end of which is connected to the transmission signal input terminal and another end of which is grounded; and
the first capacitor and the second capacitor have different capacitance values, at least one capacitor electrode included in the first capacitor is directly connected to the transmission input port electrode through a conduction via hole disposed within the multilayer substrate, and at least one capacitor electrode included in the second capacitor is directly connected to the transmission signal input terminal mounting electrode through a conduction via hole disposed within the multilayer substrate.

2. The high-frequency switch module according to claim 1, wherein the connection element includes a bonding wire, and a phase adjustment circuit arranged to change phases of the higher harmonics by an inductance of the bonding wire and a capacitance value of the first capacitor is provided.

3. The high-frequency switch module according to claim 1, wherein the at least one inductor is arranged on the first main surface side of the multilayer substrate in a stacking direction of the plurality of stacked dielectric layers and electrode layers, and the capacitor electrode is arranged on the second main surface side of the multilayer substrate in the stacking direction of the plurality of stacked dielectric layers and electrode layers.

4. The high-frequency switch module according to claim 1, wherein the filter is a low pass filter having a stopband that includes a frequency of a second or third harmonic among the higher harmonics.

5. The high-frequency switch module according to claim 1, wherein the high-frequency switch module is arranged to perform input/output of a plurality of communication signals each utilizing a specific frequency band for a transmission signal and a reception signal, and the FET switch includes a reception output port for at least each of the communication signals.

* * * * *